(12) United States Patent
Tatsumi et al.

(10) Patent No.: US 9,960,140 B2
(45) Date of Patent: May 1, 2018

(54) METAL JOINING STRUCTURE USING METAL NANOPARTICLES AND METAL JOINING METHOD AND METAL JOINING MATERIAL

(71) Applicants: NIPPON STEEL & SUMITOMO METAL CORPORATION, Tokyo (JP); WASEDA University, Tokyo (JP)

(72) Inventors: Kohei Tatsumi, Tokyo (JP); Shinji Ishikawa, Tokyo (JP); Norie Matsubara, Tokyo (JP); Masamoto Tanaka, Tokyo (JP)

(73) Assignees: NIPPON STEEL & SUMITOMO METAL CORPORATION, Tokyo (JP); WASEDA UNIVERSITY, Tokyo (JP)

( * ) Notice: Subject to any disclaimer, the term of this patent is extended or adjusted under 35 U.S.C. 154(b) by 0 days. days.

(21) Appl. No.: 15/024,682

(22) PCT Filed: Nov. 11, 2014

(86) PCT No.: PCT/JP2014/079867
§ 371 (c)(1),
(2) Date: Mar. 24, 2016

(87) PCT Pub. No.: WO2015/068853
PCT Pub. Date: May 14, 2015

(65) Prior Publication Data
US 2016/0240505 A1  Aug. 18, 2016

(30) Foreign Application Priority Data

Nov. 11, 2013 (JP) .................................. 2013-233117
Nov. 11, 2013 (JP) .................................. 2013-233118

(51) Int. Cl.
*H01L 23/48* (2006.01)
*H01L 23/52* (2006.01)
(Continued)

(52) U.S. Cl.
CPC ................ *H01L 24/32* (2013.01); *B22F 7/08* (2013.01); *B23K 35/025* (2013.01);
(Continued)

(58) Field of Classification Search
CPC combination set(s) only.
See application file for complete search history.

(56) References Cited

U.S. PATENT DOCUMENTS

2006/0017069 A1* 1/2006 Bergmann ................ C09J 5/06
  257/212
2006/0160330 A1 7/2006 Kobayashi et al.
(Continued)

FOREIGN PATENT DOCUMENTS

DE  10-2010-001666 A1  8/2011
GB  1334434 A  10/1973
(Continued)

OTHER PUBLICATIONS

Tang et al. "The configurations of nanoalloy by impact deposition: atomistic simulation on Ni-Al system" J Nanopart Res, Oct. 19, 2013, pp. 1-9.*
(Continued)

*Primary Examiner* — Telly Green
(74) *Attorney, Agent, or Firm* — Birch, Stewart, Kolasch & Birch, LLP

(57) ABSTRACT

The present invention can give a joining structure using metal nanoparticles to join the same types or different types of metal where when one surface metal is Al based, the parts are joined through a joining layer containing Ni nanoparticles, whereby a good joining strength is obtained. Further, (Continued)

by using two joining layers (6, 8) including metal nanoparticles to sandwich metal foil (7) so as to form a joining layer and joining the same type or different types of surface metals (3-4) through this joining layer, it is possible to ease the thermal stress due to the difference in amounts of thermal expansion of joined members which have two surface metals.

17 Claims, 1 Drawing Sheet

(51) Int. Cl.
| | |
|---|---|
| H01L 29/40 | (2006.01) |
| H01L 23/00 | (2006.01) |
| B23K 35/28 | (2006.01) |
| B23K 35/30 | (2006.01) |
| C22C 5/06 | (2006.01) |
| C22C 5/08 | (2006.01) |
| C22C 21/00 | (2006.01) |
| B22F 7/08 | (2006.01) |
| B23K 35/02 | (2006.01) |
| C22C 19/00 | (2006.01) |

(52) U.S. Cl.
CPC .......... *B23K 35/0244* (2013.01); *B23K 35/28* (2013.01); *B23K 35/30* (2013.01); *B23K 35/3033* (2013.01); *C22C 5/06* (2013.01); *C22C 5/08* (2013.01); *C22C 19/00* (2013.01); *C22C 21/00* (2013.01); *H01L 24/29* (2013.01); *H01L 24/83* (2013.01); *B22F 2999/00* (2013.01); *H01L 24/27* (2013.01); *H01L 2224/0345* (2013.01); *H01L 2224/03436* (2013.01); *H01L 2224/03452* (2013.01); *H01L 2224/03462* (2013.01); *H01L 2224/03464* (2013.01); *H01L 2224/04026* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/2741* (2013.01); *H01L 2224/2949* (2013.01); *H01L 2224/29083* (2013.01); *H01L 2224/29124* (2013.01); *H01L 2224/29139* (2013.01); *H01L 2224/29144* (2013.01); *H01L 2224/29155* (2013.01); *H01L 2224/29294* (2013.01); *H01L 2224/29311* (2013.01); *H01L 2224/29318* (2013.01); *H01L 2224/29339* (2013.01); *H01L 2224/29344* (2013.01); *H01L 2224/29347* (2013.01); *H01L 2224/29355* (2013.01); *H01L 2224/29639* (2013.01); *H01L 2224/29644* (2013.01); *H01L 2224/32227* (2013.01); *H01L 2224/32245* (2013.01); *H01L 2224/45144* (2013.01); *H01L 2224/83055* (2013.01); *H01L 2224/83065* (2013.01); *H01L 2224/83075* (2013.01); *H01L 2224/8384* (2013.01); *H01L 2224/83101* (2013.01); *H01L 2224/83191* (2013.01); *H01L 2224/83192* (2013.01); *H01L 2224/83193* (2013.01); *H01L 2224/83424* (2013.01); *H01L 2224/83439* (2013.01); *H01L 2224/83444* (2013.01); *H01L 2224/83447* (2013.01); *H01L 2224/83455* (2013.01); *H01L 2224/85207* (2013.01); *H01L 2924/10253* (2013.01); *H01L 2924/10272* (2013.01); *H01L 2924/15738* (2013.01); *H01L 2924/15747* (2013.01); *H01L 2924/351* (2013.01); *H01L 2924/3512* (2013.01)

(56) References Cited

U.S. PATENT DOCUMENTS

| | | | |
|---|---|---|---|
| 2009/0273066 A1 | 11/2009 | Nikitin et al. | |
| 2010/0200051 A1* | 8/2010 | Triani | H01G 9/2031 136/255 |
| 2012/0175755 A1* | 7/2012 | Bayerer | H01L 24/05 257/675 |
| 2014/0015158 A1* | 1/2014 | Cola | B01J 23/745 264/81 |
| 2014/0312361 A1* | 10/2014 | Ohtsu | H01L 24/83 257/77 |
| 2015/0210005 A1* | 7/2015 | Uliel | B29C 65/3412 156/158 |
| 2015/0210823 A1* | 7/2015 | Uliel | C08K 3/08 156/158 |

FOREIGN PATENT DOCUMENTS

| | | | |
|---|---|---|---|
| GB | 1 468 973 A | 3/1977 | |
| JP | 60-223680 A | 11/1985 | |
| JP | 2007-214340 A | 8/2007 | |
| JP | 2009-231716 A | 10/2009 | |
| JP | 2011-41955 A | 3/2011 | |
| JP | 2011-159994 A | 8/2011 | |
| JP | 2012-9703 A | 1/2012 | |
| JP | 2012009703 | * 1/2012 | |
| JP | 2013-12693 A | 1/2013 | |
| JP | 2013-197436 A | 9/2013 | |
| JP | 2013-209720 A | 10/2013 | |
| JP | 2013209720 A | * 10/2013 | |
| WO | WO 2008/062548 A1 | 6/2008 | |
| WO | WO 2007/058159 | * 8/2008 | ............... C09J 9/02 |
| WO | WO 2012/172414 A1 | 12/2012 | |
| WO | WO 2013/045345 A2 | 4/2013 | |
| WO | WO 2014/208690 A1 | 12/2014 | |

OTHER PUBLICATIONS

Levchenko et al. "Molecular dynamics simulation of the alloying reaction in Al-coated Ni nanoparticle", Computational Materials Science, Aug. 28, 2009, pp. 712-720.*

International Search Report for PCT/JP2014/079867 dated Feb. 17, 2015.

Written Opinion of the International Searching Authority for PCT/JP2014/079867 (PCT/ISA/237) dated Feb. 17, 2015.

Hashimoto et al., "Study on Bonding Technology by Nano-Nickel Particles for High-Temperature Resistant Mounting," 2013 Autumn Annual Meeting of the Japan Institute of Metals and Materials, 192, Sep. 19, 2013, with partial English translation, 6 pages.

Kato et al., "High-Temperature-Resistant Interconnections Formed by Using Nickel Micro-Plating and Ni Nano-Particles for Power Devices," Transactions of the Japan Institute of Electronics Packaging, vol. 6, No. 1, 2013 (Jun. 20, 2014), pp. 87-92.

Tanaka et al., "High Temperature Resistant Packaging for SiC Power Devices Using Interconnections Formed by Ni Micro-Electro-Plating and Ni Nano-Particles," 2015 IEEE 65th Electronic Components & Technology Conference, May 26, 2015, pp. 1371-1376.

* cited by examiner

METAL JOINING STRUCTURE USING METAL NANOPARTICLES AND METAL JOINING METHOD AND METAL JOINING MATERIAL

TECHNICAL FIELD

The present invention relates to a metal joining structure using metal nanoparticles and metal joining method and metal joining material.

BACKGROUND ART

Metal particles with an average particle size of less than 1 μm, in particular 1 to 100 nm, are called "metal nanoparticles". Metal nanoparticles are confirmed to have high bondability caused by the fine particle size and to result in bonds between particles at a far lower temperature than the melting point of the metal forming the nanometal particles. Further, the structural strength of the obtained bonds is expected to be maintained until close to the melting point of the metal. As the metal forming the metal nanoparticles, Ag is typical. In addition, Au, Cu, Ni, etc. may be mentioned (for example, PLT 1).

Metal nanoparticles are generally used as organic-metal composite nanoparticles comprised of metal nanoparticles covered by organic shells. At room temperature, the organic shells can prevent self aggregation of nanoparticles and maintain their independent dispersed form. If heating the nanoparticles supplied to the surfaces of joined members, which are the members to be joined, the organic shells are broken down and removed, the low temperature sintering function of the surface active metal nanoparticles is exhibited, and the particles are sintered and simultaneously bonded with the surfaces of the joined members.

In the field of power semiconductors, power semiconductor modules comprised of semiconductor chips etc. fixed to boards are being applied in various fields. Here, as the art which is used for connecting the semiconductor chips and boards, in the past soldering has been used.

On the other hand, along with the recent technical advances in the field of power semiconductors, realization of energy saving power devices is expected by enabling use at a higher temperature. In this regard, since soldering has been used for joining power semiconductor modules, there has been the problem that the joining structure could not be secured at a high temperature. Therefore, art is being developed for utilizing the high bondability of metal nanoparticles for use as the joining material for semiconductor chips etc. (PLTs 2 and 3).

When joining two members, if one or both of the surfaces of the joined members are Al, joining them becomes difficult. When using Ag nanoparticles for joining metal, if the metal is Al, the joining strength becomes extremely low. The oxides at the Al surface are stable, so it is believed that at the time of joining, the oxide film could not be removed. In PLT 1 as well, it is described that Al etc. are hard to join with Ag nanoparticles.

In joining an Al electrode and an Au bonding wire of a semiconductor device, the ultrasonic welding method has been used. By pressing an Au bonding wire against an Al electrode while applying ultrasonic waves, the oxide film on the Al electrode surface is broken and a metal bond between the Al electrode and Au bonding wire is made possible. In this regard, if placing the joined semiconductor device in a high temperature environment, voids are formed in the intermetallic compound phase of the joint, so the combination of Al and Au, while initially giving a high joining strength, is not suitable for use in a high temperature environment. At the time of joining Cu to Al as well, again voids are formed and deterioration results.

CITATION LIST

Patent Literature

PLT 1: Japanese Patent Publication No. 2013-12693A
PLT 2: Japanese Patent Publication No. 2011-041955A
PLT 3: Japanese Patent Publication No. 2011-159994A

SUMMARY OF INVENTION

Technical Problem

When using metal nanoparticles to join the surface metals of joined members, there are suitable combinations of surface metals' and metal nanoparticles. For example, when the surface metal is aluminum (Al) or an Al alloy, a strong film of Al oxide is formed at the surface of the surface metal. This is present at the interface between the surface metal and the metal nanoparticles, so a sufficient joining strength is not obtained.

Furthermore, when members which have a joining structure comprised of different types of metals rise in temperature or fall in temperature, since the materials differ in coefficients of thermal expansion, thermal stress due to thermal deformation occurs at the joining layer. Further, even in a joining structure comprised of the same types of metal, when becoming different temperatures, since the two joined members differ in amounts of thermal expansion, thermal stress due to thermal deformation occurs at the joining layer. Further, a joining layer using metal nanoparticles is harder than solder of course and a bulk of the metal the same as the metal nanoparticles and is lower in ductility so the thermal stress accompanying thermal deformation could not be completely eased, cracks and other defects were formed in the joining layer, and the joining strength fell. As opposed to this, it has been proposed to increase the thickness of a joining layer using metal nanoparticles so as to ease the thermal stress (PLT 2).

Further, it has been proposed to make only the vicinities of the centers of surfaces to be joined joining layers using metal nanoparticles and to make the vicinities of the outer circumferences joining layers using solder (PLT 3). However, when the facing surfaces to be joined expand by heat along with temperature changes, a difference arises in the amounts of thermal deformation of the metal nanoparticles and solder and a drop in the joining strength may be caused. Further, low melting point solder is unsuitable for use at a high temperature.

Therefore, the present invention has as its object the provision of a metal joining structure which can hold the joining strength of a joining layer when using metal nanoparticles to join the same type or different types of metal and of a metal joining method and metal joining material.

Solution to Problem

The present inventors engaged in intensive studies to solve the above problem and obtained the following findings. They discovered that when joining two metal members, even if just one is Al or an Al alloy (in the present application, the two together sometimes being referred to all together as "Al based"), by using Ni nanoparticles as the metal nanoparticles which are used for joining, the two can be joined. The reason why joining with the Al surface becomes possible when using Ni nanoparticles as the metal nanoparticles is not necessarily clear, but it is believed that if pressure is applied, the oxide film on the Al surface is partially broken and Al and Ni nanoparticles directly contact each other and that if this happens, when the temperature rises, the surface activity of the Ni nanoparticles causes a metal bond between the Al and Ni nanoparticles. Further, it is believed that part is joined through either the oxides of Al or the oxides of Ni or the oxides of both. Furthermore, sometimes nanoparticles are joined once through oxides and then, while being heated, a metal bond is formed and further a strong bond is realized.

Next, the present inventors intensively studied a joining structure for joining surface metals of two joined members not particularly limited in components. They particularly studied a joining structure able to actively use metal nanoparticles and ease the thermal stress. As a result, they discovered that forming the joining layer between the surface metals of the two joined members by a first joining layer containing metal nanoparticles, a metal foil, and a second joining layer containing metal nanoparticles in that order, the problem of thermal stress can be solved. Even when a difference arises in the amounts of thermal expansion of two joined members, the metal foil which is provided between the first joining layer and the second joining layer deforms whereby the difference in amounts of thermal expansion can be absorbed. As a result, it is possible to reduce the amount of shear deformation of the first joining layer and second joining layer using metal nanoparticles and prevent the fall in the joining strength.

Furthermore, by making the metal foil an Al-based, Ag-based, or Au-based one and, based on the above-mentioned finding, making a joining structure one using Ni nanoparticles etc., the inventors discovered that it is possible to maintain a strong joining strength and obtain an effect of easing the thermal stress by the metal foil. The present invention was made based on these findings. The gist of the present invention is as follows:

(1) A metal joining structure where surface metals of two joined members are joined through a joining layer including metal nanoparticles, wherein the surface metal of at least one said joined member is Al or an Al alloy and the metal nanoparticles are Ni nanoparticles.

(2) The metal joining structure according to (1), wherein at least one surface metal among the joined members is Al or an Al alloy and wherein the content of said Ni nanoparticles in the metal content included in the joining layer is 10 mass % or more.

(3) A metal joining method comprising the steps of forming a joining layer including metal nanoparticles between the surface metals of two joined members and heating it to join the two joined members through the joining layer, wherein the surface metal of at least one said joined member is Al or an Al alloy, the metal nanoparticles are Ni nanoparticles, and the heating temperature is 200° C. or more.

(4) The metal joining method according to (3), wherein at least one surface metal among the joined members is Al or an Al alloy and wherein the content of said Ni nanoparticles in the metal content included in the joining layer is 10 mass % or more.

(5) A metal joining structure where surface metals of two joined members are joined through a joining layer containing metal nanoparticles, wherein the joining layer is formed by a first joining layer containing metal nanoparticles, a metal foil, and a second joining layer containing metal nanoparticles in this order.

(6) The metal joining structure according to (5), wherein when the metal foil is Al or an Al alloy, the metal nanoparticles are Ni nanoparticles, while when the metal foil is any one of Ag, Au, or their alloys, the metal nanoparticles are nanoparticles comprised of at least one of Ag, Au, Cu, or Ni.

(7) The metal joining structure according to either (5) or (6), wherein, when at least one surface metal among the joined members is Al or an Al alloy, the content of Ni nanoparticles in the metal content included in the joining layer is 10 mass % or more, while, when at least one surface metal is any one of Ag, Au, or their alloys, the total of metal nanoparticles which are comprised of at least one of Ag, Au, Cu, or Ni among the metal content included in the joining layer is 10 mass % or more.

(8) The metal joining structure according to any one of (1), (2), (5), (6), and (7), wherein at least one of the joined members is comprised of Si, SiC, or a compound semiconductor covered with metal on its surface.

(9) A metal joining method comprising the steps of forming a joining layer including metal nanoparticles between the surface metals of two joined members and heating it to join the surface metals of the two joined members, wherein the joining layer is comprised of a first joining layer containing metal nanoparticles, a metal foil, and a second joining layer containing metal nanoparticles in this order, when the metal foil is Al or an Al alloy, the metal nanoparticles are Ni nanoparticles, while, when the metal foil is any one of Ag, Au, or their alloys, the metal nanoparticles are nanoparticles comprised of at least one of Ag, Au, Cu, or Ni, and the heating temperature is 200° C. or more.

(10) The metal joining method according to (9), wherein, when the metal foil included in the joining layer is Al or an Al alloy, the content of Ni nanoparticles is 10 mass % or more, while, when the metal foil is any one of Ag, Au, or their alloys, the total of the metal nanoparticles comprised of at least one of Ag, Au, Cu, or Ni is 10 mass % or more.

(11) A metal joining material comprising of a first joining layer containing metal nanoparticles, a metal foil, and a second joining layer containing metal nanoparticles formed in this order.

(12) The metal joining material according to (11), wherein when the metal foil is Al or an Al alloy, the metal nanoparticles are Ni nanoparticles, while, when the metal foil is any one of Ag, Au, or their alloys, the metal nanoparticles are nanoparticles comprised of at least one of Ag, Au, Cu, or Ni.

Advantageous Effects of Invention

The present invention provides a joining structure and joining method whereby a joining layer containing metal nanoparticles is formed between the surface metals of the two joined members and whereby the surface metals of the two joined members are joined by the metal nanoparticles in the joining layer, wherein even if one or both of the metal members are Al based, joining the two becomes possible by using Ni nanoparticles as the metal nanoparticles which are used for the joining operation.

Further, by forming the joining layer between two metal members by a first joining layer containing metal nanoparticles, an Al-based, Au-based, or Ag-based metal foil, and a second joining layer containing metal nanoparticles in that order, when a difference occurs in the amounts of thermal expansion of the metal members, deformation of the metal foil provided between the first joining layer and the second joining layer enables the difference in the amounts of thermal expansion to be absorbed. As a result, it is possible to reduce the amounts of shear deformation of the first joining layer and the second joining layer and prevent a drop in the joining strength.

DESCRIPTION OF EMBODIMENTS

In the present invention, "metal nanoparticles" mean metal particles with average particle sizes of less than 1 μm. By using such fine particles as the joining layer in a joining structure, it is possible to cause the particles to bond at a temperature far lower than the melting point of the metal forming the metal nanoparticles. The structural strength of the obtained bonds can be maintained up to the vicinity of the melting point of the metal. The average particle size of the metal nanoparticles is preferably made 500 nm or less. If made 100 nm or less, the sintering ability at a low temperature is increased, so this is further preferable. On the other hand, if the average particle size of the metal nanoparticles is too small, the ratio of the surface oxides and organic components becomes larger and the joinability falls. Therefore, the average particle size of the metal nanoparticles is preferably made 5 nm or more.

Regarding the method of measuring the average particle size of the metal nanoparticles, it is possible to directly observe the average particle size of the metal nanoparticles by a high resolution SEM or TEM and find the average particle size.

The present invention relates to a joint structure which joins the surface metals of two joined members through a joining layer including metal nanoparticles. Here, the "surface metal" means the metal which contacts a joining layer and is used for joining. That is, the form is not particularly limited so long as it is a metal forming a surface at a joined member.

For example, it is also possible to form on one face of a polyhedron made of metal a layer of another metal and to use that metal layer as a surface to be joined. In this case, the metal layer forming the surface to be joined corresponds to the "surface metal" referred to in the present application.

Further, for example, a metal layer may be formed on one face of a semiconductor, ceramic, plastic, or other nonmetal polyhedron. In this case as well, the metal layer forming this surface corresponds to the "surface metal" referred to in the present application.

Of course, in a polyhedron made of metal, that one face itself may be made the surface to be joined. Whatever the case, the method and mode of formation of the metal layer are also not particularly limited. For example, chemical vapor deposition (CVD), physical vapor deposition (PVD), electroplating, electroless plating, adhesion or bonding of metal foil, etc. may be used to form the metal layer. Below, in this application, a metal part forming the surface metal, including the above-mentioned metal layer, will be called a "metal member".

Figure 1:
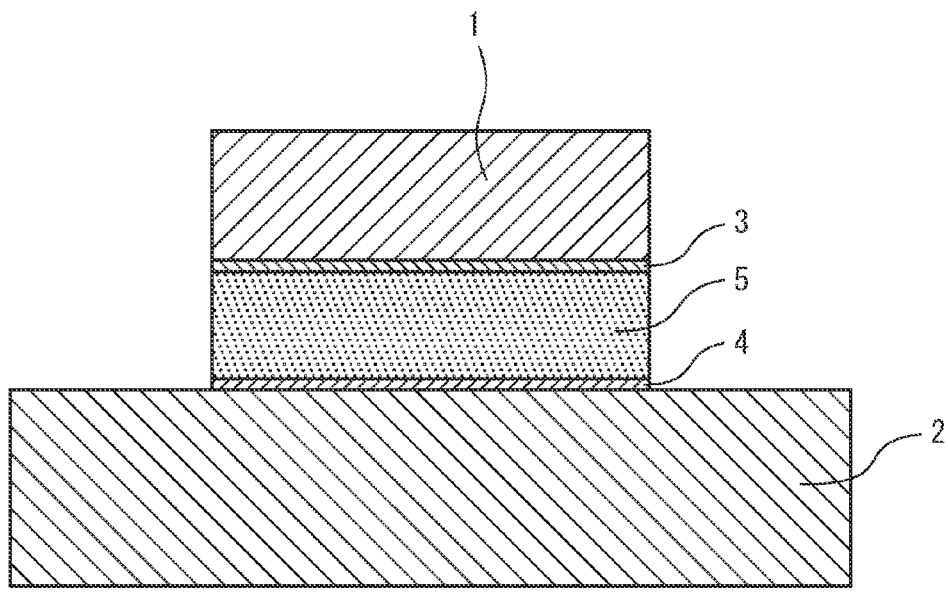
FIG. 1 is a cross-sectional view showing one example of a metal joining structure of the present invention (first aspect).

First, a first aspect of the present invention will be explained based on FIG. 1. FIG. 1 shows objects to be joined (unjoined members) 1 and 2 on the surfaces of which metal members (in the figure, formed in layers) 3 and 4 are formed. FIG. 1 shows a joining structure of two metal members 3, 4 joined through a joining layer 5 containing metal nanoparticles.

In the metal joining structure and metal joining method of the present invention, one or both of two metal members are Al or an Al alloy and the metal nanoparticles are Ni metal or an Ni alloy. In the past, when a surface to be joined was Al based, it was considered that joining using metal nanoparticles would be difficult (PLT 1). The oxides on the Al surface are stable, so at the time of joining, the oxide film could not be removed. As opposed to this, in the present invention, it was found for the first time that by using Ni nanoparticles as the metal nanoparticles which are used for the joining operation, even if the metal members are Al or an Al alloy, joining the two becomes possible. The reason why joining with an Al surface becomes possible when using Ni nanoparticles as the metal nanoparticles is not necessarily clear, but it is believed that when pressed, the oxide film on the Al surface is partially broken and that the Al and Ni nanoparticles directly contact each other, whereupon when the temperature rises, the surface activity of the Ni nanoparticles causes the metals of the Al and Ni nanoparticles to bond. Further, it is believed that part is joined through one or both of the oxides of Al and the oxides of Ni. Further, sometimes the nanoparticles are joined once via the oxides and then are heated during which a metal bond is formed and therefore a further stronger bond is realized.

The Al forming the metal members means a material having an Al content of 98.0 mass % or more. This balance is comprised of nonspecific impurities or trace elements. The material described in JIS H 4160 can be suitably used. The Al alloy forming the metal members is not particularly restricted so long as the Al content in the alloy is 85 mass % or more, but the Al alloy prescribed in the JIS standards can suitably be used.

If a high conductivity is sought, Al-2 mass % Si, Al-2 mass % Cu, Al-1 mass % Si-0.5 mass % Cu, Al-1 mass % Si-0.1 mass % Zr, Al-4 mass % Cu etc. which are relatively high in purity and are high in heat resistance can suitably be used. Further, alloying enables the heat resistance to be raised, so for example Al-2.2 mass % Si, Al-1 mass % Si-0.5 mass % Cu-0.6% mass Fe, Al-1 mass % Si-1.0 mass % Fe-0.2 mass % Cu, or Al-1 mass % Fe-0.5 mass % Si-0.2 mass % Cu-0.8 mass % Mn can be suitably used.

At the interface of the Ni nanoparticles and Al or an Al alloy, it could be confirmed that a strong joint was obtained between the metals or through the oxides and a highly reliable joined state could be maintained even in use at a 350° C. or more high temperature.

The Ni nanoparticles which form the metal nanoparticles preferably contain Ni: 95 mass % or more, but they may also contain alloy elements other than Ni. The "alloy elements" mean, for example, alloy elements which include one or more of Ag, Cu, Fe, and P.

Furthermore, from the above findings, when one of the metal members is Al or an Al alloy, the other of the metal members used is preferably Al, Cu, Ag, Au, Ni, or their alloy.

Figure 2:
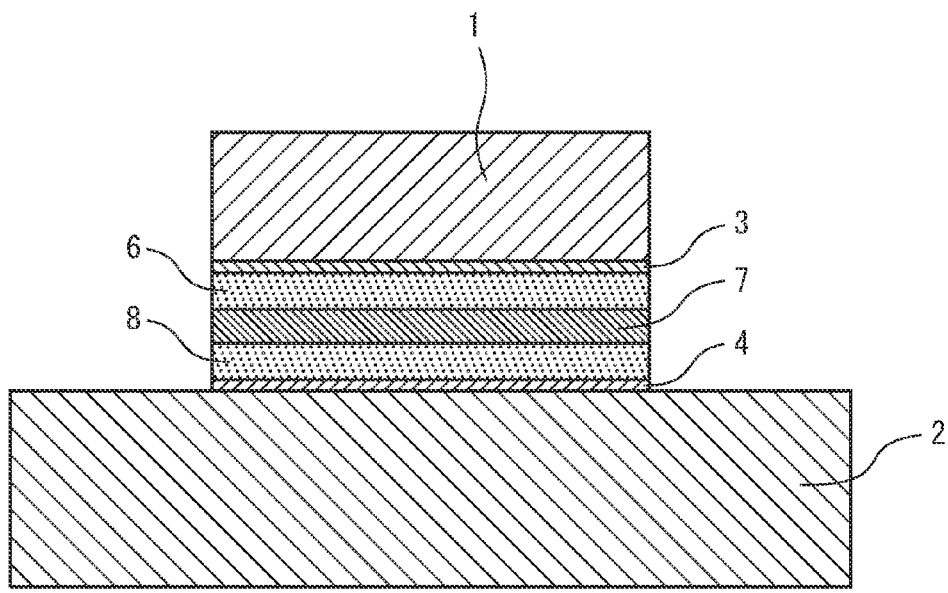
FIG. 2 is a cross-sectional view showing one example of a metal joining structure of the present invention (second aspect).

Next, a second aspect of the present invention will be explained based on FIG. 2. FIG. 2 shows objects to be joined (unjoined members) 1 and 2 on the surfaces of which metal members (in the figure, formed in layers) 3 and 4 are formed. FIG. 2 shows a joining structure of two metal members 3 and 4 joined through a joining layer containing metal nanoparticles, but this joining layer is comprised of two joining layers containing metal nanoparticles (in the present application, for convenience, called the "first joining layer 6" and the "second joining layer 7") which sandwich a metal foil 7.

In the first aspect, when using metal nanoparticles for a joining operation, as shown in FIG. 1, a joining layer 5 containing metal nanoparticles was formed between the two metal members 3 and 4. In this regard, when members 1 and 2 which have a joining structure rise in temperature or fall in temperature, if the two joined members are comprised of different materials and the respective materials differ in coefficients of thermal expansion or if the two joined members differ in temperature, the two joined members will differ in amounts of thermal expansion, so thermal stress due to thermal deformation will occur at the joining layer. Further, a joining layer using metal nanoparticles is harder than solder of course and a bulk of the metal the same as the metal nanoparticles and is lower in ductility so the thermal stress accompanying thermal deformation might not be completely eased, cracks and other defects may be formed in the joining layer, and the joining strength may fall.

In the present invention, as shown in FIG. 2, the above problem was successfully solved by forming between the two metal members a first joining layer containing metal nanoparticles, a metal foil, and a second joining layer containing metal nanoparticles in that order. Even if a difference arises in the amounts of thermal expansion of the two joined members having metal members, the metal foil which is provided between the first joining layer and the second joining layer deforms, whereby the difference in the amounts of thermal expansion can be absorbed and as a result the amounts of shear deformation of the first joining layer and second joining layer using the metal nanoparticles can be reduced and the drop in joining strength can be prevented.

When the two joined members are comprised of different materials and the respective materials differ in coefficients of thermal expansion, the problem of thermal stress already occurs when heating the metal nanoparticles to make them sinter. For example, in the joining structure shown in FIG. 1, when one of the joined members 1 is comprised of Si and the other of the joined members 2 is comprised of Cu, Si and Cu differ in coefficients of thermal expansion. If performing the heat treatment for making the metal nanoparticles sinter at 300° C., the Si and Cu are fixed in length by the margins of thermal expansion respectively corresponding to 300° C. If sintering proceeds under these circumstances, the joining layer 5 is formed. If after that the temperature falls to ordinary temperature, since the two joined members differ in amounts of thermal shrinkage, thermal deformation due to thermal stress occurs in the joining layer 5. The joining layer 5 obtained by causing the metal nanoparticles to sinter is low in ductility, so even with that extent of thermal stress, the inside of the joining layer will crack and as a result the joining layer made using the metal nanoparticles will become insufficient in shear strength. As opposed to this, according to the structure shown in FIG. 2, the metal foil which is provided between the first joining layer and the second joining layer deforms, whereby the difference in the amounts of thermal expansion can be absorbed. As a result, the amounts of shear deformation of the first joining layer and second joining layer using the metal nanoparticles can be reduced and the drop in joining strength can be prevented.

As the metal foil which is provided at the metal joining structure of the present invention, use of Al or an Al alloy is preferable. This is because Al or an Al alloy is excellent in ductility and is suitable for absorbing the difference of the amount of thermal expansion applied to the joining structure.

As opposed to this, as explained in the first aspect of the present invention, by using Ni nanoparticles as the metal nanoparticles which are used for the joining operation, even if the metal members are Al or an Al alloy, the metal nanoparticles can be joined with.

The Al forming the metal foil layer means a material having an Al content of 98.0 mass % or more. This balance is comprised of nonspecific impurities or trace elements. The material described in JIS H 4160 can be suitably used. The Al alloy forming the metal foil layer is not particularly restricted so long as the Al content in the alloy is 85 mass % or more, but an Al alloy which is excellent in malleability/ductility and electrical conductivity can suitably be used. Further, alloying enables the foil to be raised in heat resistance, so Al-2 mass % Si, Al-1 mass % Si-0.5 mass % Cu-0.6 mass % Fe, Al-1 mass % Si-1.0 mass % Fe-0.2 mass % Cu, Al-1 mass % Si-0.1 mass % Zr, Al-4 mass % Cu, etc. can be suitably used. Further, alloying enables the heat resistance to be raised, so for example Al-2.2 mass % Si, Al-1 mass % Si-0.5 mass % Cu-0.6% mass % Fe, Al-1 mass % Si-1.0 mass % Fe-0.2 mass % Cu, and Al-1 mass % Fe-0.5 mass % Si-0.2 mass % Cu-0.8 mass % Mn can be suitably used.

When the metal forming the metal foil layer is Al, the joining layer is the same in both the first aspect and second aspect. A metal content other than Ni nanoparticles may also be contained in the joining layer. The other metal content may be metal nanoparticles other than Ni or may be large size metal powder with an average particle size of 1 μm to less than 100 μm. If made metal nanoparticles, Ag, Au, Cu, and Sn metal or alloy can be used.

Further, in the case of large size metal powder, Ni, Ag, Au, Cu, Sn metal or alloy may be used. In any case, a surface comprised of Al or an Al alloy is joined with the Ni nanoparticles, the large size metal powder is joined with the surrounding metal nanoparticles, a surface other than Al is joined with the metal nanoparticles, and the metal nanoparticles are joined with each other, so as a result a joining layer which has an excellent joining strength can be formed. In the metal content contained in the joining layer, the greater the total content of the Ni nanoparticles, the better the joining strength that can be obtained. On the other hand, if the content of Ni nanoparticles is 10 mass % or more, a sufficient bonding strength for the present invention can be secured. Making the content of Ni nanoparticles 50 mass % or more is preferable. Making it 80 mass % or more is more preferable.

In the past, it was difficult to weld Al materials with other metal materials (including Al). This was because removing the oxide film formed on the Al surface was hard. However, in joining an Al electrode and Au bonding wire of a semiconductor device, the ultrasonic welding method is used. By pressing the Au bonding wire against the Al electrode while applying ultrasonic waves, it is possible to break the oxide film on the Al electrode surface and join the metals of the Al electrode and Au bonding wire.

In this regard, if placing a joined semiconductor device in a high temperature environment, voids are formed in the intermetallic compound phase of the joint, so the combination of Al and Au, while initially giving a high joining strength, is not suitable for use in a high temperature environment. As opposed to this, in the present invention, at the joint of the surface to be joined with the Al and Ni nanoparticles, voids are not formed in the joint even in a 300° C. or more high temperature environment, so the problem of deterioration of the joining strength does not occur. Therefore, even with a material which is used in a high temperature environment or a material which is used in an environment of a repeated thermal cycle of a high temperature and low temperature, a suitable joining strength can be maintained.

When the metal foil is comprised of any one of Ag, Au, or their alloys, as the metal nanoparticles which are contained in the first joining layer and second joining layer containing the metal nanoparticles, it is possible to use metal nanoparticles comprised of one or more of Ag, Au, Cu, and Ni. At the joining interface of the Ag nanoparticles, Au nanoparticles, Cu nanoparticles, or Ni nanoparticles and the Ag metal foil or Au metal foil, it is possible to maintain a highly reliable joined state in use at a 350° C. or more high temperature.

The "Ag" which forms the metal foil means a material of an Ag content of 90 mass % or more. Further, an "Ag alloy" means an alloy in which the Ag content in the alloy is 60 mass % or more and alloy elements constituted by for example one or both of Au and Pd are contained. For example, Ag-11% Au, Ag-15% Cu-15% Zn, and Ag-22% Cu-17% Zn-5% Sn may be suitably used. Further, the surface may also be plated with Au, Pd, etc.

Similarly, the "Au" which forms the metal foil means a material of an Au content of 90 mass % or more. Further, an "Au alloy" means an alloy in which the Au content in the alloy is 60 mass % or more and alloy elements constituted by for example one or more of Ag, Cu, Mn, and Pd are contained. For example, an Au-11% Ag alloy is suitably used. Further, the surface may also be plated with Au, Ag, Pd, etc. For the Ni metal and Ni alloy, the ones mentioned before can be used.

Further, when the metal foil is Ag or Au based, the joining layer may contain metal content other than metal nanoparticles comprised of one or more of Ag, Au, Cu, and Ni. As other metal content, nanoparticles of various types of metals may be used or large size metal powder of average particle sizes of 1 µm or more may be used. If using metal nanoparticles, Sn, Zn, or their alloys may be used.

Further, if made large size metal powder, Ni, Ag, Au, Cu, Sn, Zn, or their alloys can be used. Whatever the case, the metal foil surface and the surface to be joined are joined with the metal nanoparticles, the large size metal powder is joined with the surrounding metal nanoparticles, and the metal nanoparticles are also joined with each other, so as a result a joining layer having a good joining strength can be formed. If the total content of metal nanoparticles comprised of at least one type of Ag, Au, Cu, and Ni is 10 mass % or more, in the present invention, sufficient bonding force can be secured. The total content of these metal nanoparticles is preferably made 50 mass % or more. 80 mass % or more is more preferable.

In the present invention, the joining layer including the metal nanoparticles forms its overall joining strength by the joining of metals. The joining layer does not have to contain components other than metals. As explained later, when forming a joining layer including metal nanoparticles, a metal nanoparticle paste is formed and covered on the joint, then the parts are heated to 200° C. or more to realize the join by the metal nanoparticles. The metal nanoparticle paste is comprised of metal nanoparticles dispersed in an ether-based or other solvent. Further, the metal nanoparticles are covered by organic shells.

Therefore, the joining layer before heating contains the solvent component and organic shells in the paste. By heating to 200° C. or more, the solvent component and components of the organic shells break down. Part evaporates and escapes from the joining layer, while the remainder is carburized by the high heat and remains in the joining layer. The components which are carburized and remain do not contribute to the joining strength of the joining layer. Even if the joining layer contains components other than metal, if making the metal content contained in the joining layer 50 vol % (excluding parts with cavities or voids) or more of the total solid components in the joining layer, preferably 70 vol % or more, the effects of the present invention can be sufficiently exhibited.

The metal foil in the present invention is not particularly limited so long as a metal material of a thickness of 5 to 200 µm. Metal foil which is obtained by rolling various types of metal by a roller may be mentioned. Preferably, the thickness of the metal foil is 5 to 100 µm, more preferably it is 10 to 50 µm. If the thickness is less than 5 µm, the possibility of cracks and other defects forming at the time of pressing the parts at the time of joining them rises. If the thickness becomes greater, it becomes difficult to maintain the flatness, strain is inhibited at the time of winding onto a reel and productivity otherwise falls or an increase in the cost of the material is incurred, so the thickness is preferably made one not more than the above upper limit value. Further, the material of the metal foil preferably is one with an elasticity of 110 GPa or less, more preferably 85 GPa or less. If the elasticity is over 110 GPa, the effect of easing stress is small and the danger of thermal stress etc. causing damage to the Si chip devices etc. rises.

The thicknesses of the first joining layer and the second joining layer containing the metal nanoparticles after the end of heating should respectively be made 0.5 to 100 µm, more preferably 3 to 50 µm.

The joined assembly having the joining structure of the present invention can be obtained by placing a semiconductor device at one of the two joined members, placing a metal board, resin board, or ceramic board at the other, and heating together their joining materials and the joined members. In particular, an Si, SiC, compound semiconductor, or other board may be covered with a metal for use as the metal to be joined in application of the present invention. As the metal board, an aluminum board, an iron board, copper-based board, stainless steel board, etc. may be mentioned. As the resin board, an epoxy resin board, phenol resin board, etc. may be mentioned. As the ceramic board, an alumina board, silicon carbide board, nitride-based board, etc. may be mentioned.

As the metal joining method for forming the metal joining structure of the present invention, one method may be selected from the several methods explained below.

In a first method, the metal member forming the surface to be joined of one of the joined members (first surface to be joined) is covered by the first joining layer containing metal nanoparticles, then the first joining layer is covered by a metal foil, further the metal foil is covered by a second joining layer containing metal nanoparticles, and finally the metal member forming the surface to be joined of the other of the joined members (second surface to be joined) is covered.

In a second method, the metal member forming the surface to be joined of one of the joined members (first surface to be joined) is covered by the first joining layer containing metal nanoparticles, while a second joining layer containing other metal nanoparticles is covered over the metal member forming the surface to be joined of the other of the joined members (second surface to be joined). Next, the first joining layer and second joining layer are made to face each other, metal foil is interposed between them, and the first joining layer, metal foil, and second joining layer are made to contact each other.

In a third method, the two sides of a metal foil are respectively covered by a first joining layer and second joining layer containing metal nanoparticles and the result is used as the metal joining material. Next, one surface of the metal joining material (side of first joining layer) is brought into contact with the metal member forming the first surface to be joined and the other surface (side of second layer to be joined) is brought into contact with the metal member forming the second surface to be joined to thereby form the joining structure.

Any of the above first to third methods is used to form the joining structure, then it is heated to a 200° C. or higher temperature to join the two members. Due to the heating, the metal nanoparticles together, the surfaces to be joined and metal nanoparticles, and the metal foil surface and metal nanoparticles can be sintered and a strong bonding strength can be realized. To obtain a sufficient joining strength, the heating temperature when producing this joined assembly is preferably 200° C. or more, more preferably 250° C. or more. Further, if the heating temperature is over 450° C., the semiconductor device or resin board etc. is liable to be damaged, so the temperature is preferably 450° C. or less, more preferably 400° C. or less. Further, at the same time as heating the joined assembly, it is preferable to apply pressure to the joining material and the joined members. This pressure is preferably 0.1 to 100 MPa, more preferably 2 to 30 MPa.

When forming a layer including metal nanoparticles on the a surface to be joined or metal foil, a paste containing the metal nanoparticles is prepared and this metal nanoparticle paste is coated on the surface to be joined. As the metal nanoparticle paste, metal nanoparticles covered by organic shells were prepared and the metal nanoparticles were dispersed in a predetermined solvent to obtain a slurry-like, paste-like, grease-like, wax-like, or other such composition.

The joining layer can be formed by coating the composition by, for example, an air spray coater, roll coater, electrostatic spray coater, etc. on the surface to be joined and metal foil in a layer.

To prepare a composition containing metal nanoparticles, a protective agent is suitably selected from an amine-based, carboxylic acid-based, and polymer-based compound, a dispersant is suitably selected from an amine-based, carboxylic-acid based, and alcohol-based compound, and a solvent is suitably selected from an alcohol-based or ether-based compound in accordance with the type of the metal nanoparticles. Further, if necessary, it is possible to add to this composition a dispersion aid selected from various types of conventional known anionic, cationic, nonionic, or other aids so as to impart the desired fluidity etc. to the composition. The solvent content in the metal nanoparticle paste is preferably 5 to 80 mass % or so. More preferably it is 10 to 50 mass %.

If using a metal nanoparticle paste to form a joining layer and then heating it to make the metal nanoparticles sinter, the solvent in the metal nanoparticle paste is driven out and the metal content in the joining layer can be made 50 vol % or more or further 70 vol % or more or otherwise the above-mentioned preferable range of content of metal content.

EXAMPLES

Example 1

In the joining structure for joining two members 1 and 3 shown in FIG. 1, the first aspect of the present invention was applied. The material and size of the joined member 1, the material and size of the other joined member 2, the material of the metal member 3 and thickness of that metal member, and the material of the other metal members 4 and thickness of the metal member are shown in Table 1.

TABLE 1

| | First joining layer | | | | | | First joined member | | Second joined member | |
| | Ni-based nanoparticles | | | Metal content before heating, mass % | Thickness after joining, μm | | | First surface to be joined | | Joined member |
| No. | Type | Average dia. nm | Content in metal, mass % | Other metal content Type | | | | Type | Size, mm sq. | Type | Thickness, μm | Type | Size, mm sq. |
|---|---|---|---|---|---|---|---|---|---|---|---|---|---|
| 1 | Ni | 50 | 100 | — | 77 | 2 | | Si | 2 | Al | 4 | Si | 7 |
| 2 | Ni | 50 | 100 | — | 76 | 35 | | SiC | 2.7 | Al | 3 | DBC*3 | 15 |
| 3 | Ni | 80 | 80 | Ag*1 | 66 | 15 | | SiC | 2.7 | Al | 5 | AMC*5 | 15 |
| 4 | Ni | 30 | 20 | — | 66 | 15 | | SiC | 2.7 | Al | 5 | SiC | 7 |
|   | Ni | 800 | 80 | | | | | | | | | | |
| 5 | Ni | 30 | 100 | — | 60 | 7 | | Al*2 | 2 | Al*2 | | Al*2 | 2 |
| 6 | Ni | 50 | 100 | — | 85 | 4 | | Si | 2 | Al | 4 | Si | 7 |
| 1 | | | 0 | Ag*1 | 60 | 10 | | Si | 2 | Al | 4 | Si | 10 |
| 2 | | | 0 | Ag*1 | 60 | 10 | | Si | 2 | Ag*6 | 4 | Si | 2 |
| 3 | | | | None | | | | Si | 2 | Al | 2 | | Au wire |

TABLE 1-continued

| | | Second joined member Second surface to be joined | | Joining heating conditions | | | | Joint quality Shear strength, MPa | | |
|---|---|---|---|---|---|---|---|---|---|---|
| No. | Type | Thickness, μm | Temp., °C. | Time, min. | Pressure, MPa | Atmosphere | Right after joining | After 350° C. reheating | After 400° C. reheating |
| 1 | Al | 4 | 300 | 30 | 30 | Air | 42 | 52 | 50 |
| 2 | Au*4 | 4 | 330 | 60 | 15 | Air | 50 | 52 | 49 |
| 3 | Au | 1 | 350 | 60 | 15 | *7 | 32 | 33 | 31 |
| 4 | Al | 4 | 350 | 60 | 15 | *7 | 33 | 32 | 30 |
| 5 | Al*2 | | 300 | 90 | 30 | *7 | 50 | 48 | 49 |
| 6 | Al | 4 | 280 | 30 | 15 | Air | 31 | 35 | 33 |
| 1 | Al | 4 | 280 | 30 | 15 | Air | 13 | 5 or less | 5 or less |
| 2 | Ag*6 | 4 | 20 | 30 | 15 | Air | 32 | 32 | 30 |
| 3 | Au wire | | Ultrasonic welding | | | | 30 | 15 | 5 or less |

*1Ag nanoparticles (average size 50 nm),
*2Al-2mass % Cu,
*3ceramic board (DBC),
*4Au (base Ni/Cu) total 4 μm,
*5ceramic board (AMC-SiN),
*6Ag 4 μm (base Cr/Ni), and
*7: 3% hydrogen-argon.

A metal nanoparticle paste was prepared for forming the joining layer 5. As a solvent, the ether-based solvent terpineol was used to diffuse the metal nanoparticles and other metal content in the solvent. The content of the metal content before heating is shown in Table 1. The parts other than the content of the metal content are the solvent and the organic shells covering the metal nanoparticles.

For the joining layer 5, a metal nanoparticle paste was coated on the first surface to be joined, the second surface to be joined was placed on the surface coated by that paste, and the assembly was press bonded at the temperature, pressure, holding time, and atmosphere shown in Table 1.

The types and average sizes of Ni nanoparticles in the metal nanoparticle layer forming the joining layer 5, the content of Ni nanoparticles in the metal content of the metal nanoparticle layer as a whole (content in metal), the metal content in the metal nanoparticle layer other than Ni nanoparticles (other metal content), the content of the metal content in the metal nanoparticle paste before heating (content of metal content before heating), and the thickness of joining layer after joining after the end of heating are shown in Table 1. The average size of the metal nanoparticles was measured by TEM observation. Note that, at the joining layer after joining after the end of heating, the content of the metal content was 50 vol % or more in each case. The majority of the content other than the metal content was the residue after the solvent and the organic shells of the metal nanoparticles were carburized by heating.

The joined assembly finished being joined was treated as follows:
(1) Cooled to ordinary temperature after joining
(2) After being joined and cooled to ordinary temperature, heat treated at 350° C. in a nitrogen atmosphere for 1 hour and cooled to ordinary temperature
(3) After being joined and cooled to ordinary temperature, heat treated at 400° C. in a nitrogen atmosphere for 1 hour and cooled to ordinary temperature. The joint were measured for shear strength (n=10). The results are shown in Table 1.

Invention Example Nos. 1, 2, 5, and 6 of Table 1 contain as metal content in the metal nanoparticle layers only average size 30 and 50 nm Ni nanoparticles and have one or both of the metal members formed by Al or an Al alloy. Further, Invention Example No. 3 is an invention example which contains Ni nanoparticles and Ag nanoparticles, while Invention Example No. 4 is an invention example which mixes Ni nanoparticles of average sizes of 30 nm and 800 nm. Whatever the case, as the quality of the joint, the shear strength is a good strength of 25 MPa or more right after joining, after heating to 350° C., and after heating to 400° C.

On the other hand, Comparative Example Nos. 1 and 2 do not contain Ni nanoparticles in the metal nanoparticle layer and contain only Ag nanoparticles. Comparative Example No. 1 has both metal members made of Al. Right after joining, the shear strength is a low value of 13 MPa, while after heating to 350° C. and after heating to 400° C., almost no shear strength could be obtained. Comparative Example No. 2 has metal members made of Ag and is outside the present invention on this point.

Comparative Example No. 3 differs from the present invention. This is a comparative example where one of the joined members is Au wire, a metal nanoparticle layer was not used, and ultrasonic welding was used for the joining operation. The shear strength right after the joining operation was good, but the shear strength after heating at 350° C. and after heating at 400° C. greatly fell. This is because in a high temperature environment, voids are formed in the intermetallic compound phase of the joint.

Example 2

In the joining structure joining two members 1 and 2 such as shown in FIG. 2, the second aspect of the present invention was applied (Invention Examples 1 to 9 of Table 1). In Comparative Example 1, the structure shown in FIG. 1 was used. The materials and sizes of the members 1, 2, the materials of the metal members 3 and 4, and the thicknesses of the metal members are shown in Table 2.

TABLE 2

| | First joining layer | | | | | | | Second joining layer | | | | | |
|---|---|---|---|---|---|---|---|---|---|---|---|---|---|
| | Metal nanoparticles | | Other metal | Metal content before heating, mass % | Thickness after joining, μm | Metal foil | | Metal nanoparticles | | Other metal | Metal content before heating, mass % | Thickness after joining, μm |
| No. | Type | Average dia. nm | Content in metal, mass % | content Type | | | Type | Thickness | Type | Average dia. nm | Content in metal, mass % | content Type | |
| 1 | Ni | 50 | 100 | — | 77 | 7 | Al | 12 | Ni | 90 | 100 | — | 63 | 6 |
| 2 | Ni | 50 | 100 | — | 60 | 6 | Al | 12 | Ni | 60 | 100 | — | 63 | 6 |
| 3 | Ag | 8 | 100 | — | 70 | 12 | Ag | 30 | Ag | 8 | 100 | — | 70 | 12 |
| 4 | Cu | 20 | 100 | — | 76 | 35 | Ag | 15 | Cu | 20 | 100 | — | 76 | 35 |
| 5 | N | 80 | 100 | — | 66 | 15 | Al | 12 | Ni | 20 | 20 | — | 60 | 13 |
| | | | | | | | | | Cu | 60 | 80 | — | | |
| 6 | Ni | 30 | 100 | — | 77 | 11 | Ag | 15 | Ag | 11 | 100 | — | 65 | 22 |
| 7 | Au | 10 | 100 | — | 85 | 4 | Au | 8 | Ag | 11 | 100 | — | 65 | 22 |
| 8 | Ni | 50 | 100 | — | 70 | 12 | Al | 12 | Ni | 20 | 35 | Al*2 | 55 | 15 |
| 9 | Ni | 50 | 100 | — | 60 | 6 | Al alloy*1 | 12 | Ni | 60 | 100 | — | 63 | 6 |
| 1 | Ni | 50 | 100 | — | 77 | 15 | — | — | Ni | 90 | 100 | — | 63 | 12 |

| | First joined member | | | | Second joined member | | | | Joining heating conditions | | | | Joint quality |
|---|---|---|---|---|---|---|---|---|---|---|---|---|---|
| | Joined member | | First surface to be joined | | Joined member | | Second surface to be joined | | | | | | Shear strength, MPa |
| No. | Type | Size, mm sq. | Type | Thickness, μm | Type | Size, mm sq. | Type | Thickness, μm | Temp., °C. | Time, min. | Pressure, MPa | Atmosphere | |
| 1 | Si | 2 | Al | 4 | Cu | 10 | Ag | 3 | 300 | 30 | 15 | N | 52 |
| 2 | Si | 2 | Al | 4 | Cu | 10 | Ag | 3 | 300 | 30 | 30 | Air | 32 |
| 3 | Si | 2 | Ag | 1 | FR4+3 | 45 | Au | 1 | 200 | 30 | 2 | Air | 26 |
| 4 | SiC | 2 | Ag | 3 | DBC*4 | 15 | Au | 1 | 300 | 60 | 5 | *7 | 38 |
| 5 | SiC | 2 | Ag | 3 | AMC*5 | 15 | Au | 1 | 60 | 10 | 10 | *7 | 33 |
| 6 | Si | 2 | Al | 5 | DBA*6 | 15 | Au | 1 | 90 | 15 | 15 | N | 47 |
| 7 | Si | 2 | Ag | 1 | Cu | 10 | Ag | 3 | 250 | 30 | 15 | Air | 31 |
| 8 | Si | 2 | Al | 4 | Cu | 10 | Ag | 3 | 300 | 30 | 15 | N | 41 |
| 9 | Si | 2 | Al | 4 | Cu | 10 | Ag | 3 | 300 | 30 | 30 | *7 | 35 |
| 1 | Si | 2 | Al | 5 | Cu | 10 | Ag | 3 | 300 | 30 | 15 | N | ≤12 |

*1Al—1Fe—0.5Si—0.2Cu—0.8Mn (mass %),
*2Average particle size 3 μm Al powder,
+3Resin board (FR4),
*4Ceramic board (DBC),
*5Ceramic board (AMC-SiN),
*6Ceramic board (DBA),
*7: 3% hydrogen-nitrogen A metal nanoparticle paste was prepared for forming the first joining layer 6, second joining layer 8, and joining layer 5. As a solvent, the ether-based solvent terpineol was used to diffuse the metal nanoparticles and other metal content in the solvent. The content of the metal content before heating is shown in Table 2. The parts other than the metal content are the solvent and the organic shells covering the metal nanoparticles.

In the joining structure shown in FIG. 2, the metal member forming the surface to be joined of one of the members (first surface to be joined) was coated with a metal nanoparticle paste by the squeegee method to form the first joining layer. Similarly, the metal member forming the surface to be joined of other of the members (second surface to be joined) was coated with a metal nanoparticle paste by the squeegee method to form the second joining layer. Next, the first joining layer and the second joining layer were made to face each other, metal foil was interposed between them, and the first joining layer, metal foil, and second joining were made to contact each other. In the joining layer 5 shown in FIG. 1, the metal nanoparticle paste was coated on one of the surfaces to be joined and the other of the surfaces to be joined was placed over that paste-coated surface. In the embodiments shown in FIG. 1 and FIG. 2 as well, the components were press bonded under the temperature, pressure, holding time, and atmosphere shown in Table 2 and sintered.

The types and average sizes of the metal nanoparticles in the metal nanoparticle layer forming the first joining layer 6, second joining layer 8, and joining layer 5, the content of metal nanoparticles in the metal content of the metal nanoparticle layers as a whole (content in metal), the metal content in the metal nanoparticle layers other than the metal nanoparticles (other metal content), the joining layer thickness after joining after the end of heating, and the type and thickness of the metal foil layer are shown in Table 1. The average size of the metal nanoparticles was measured by TEM observation. Note that, at the joining layer after joining after the end of heating, the content of the metal content was 50 vol % or more in each case. The majority of the content other than the metal content was the residue after the solvent and the organic shells of the metal nanoparticles were carburized by heating.

The joined assembly finished being joined was cooled to ordinary temperature after the joining operation, then was measured for shear strength (n=10). The results are shown in Table 2. In all of Invention Examples 1 to 9 and Comparative Example 1, the two joined members differ in coefficients of thermal expansion, so it is believed that after the above heat treatment for causing the metal nanoparticles to sinter finished, the amount of thermal shrinkage when returned to ordinary temperature differed and the thermal stress acted on the joined assembly. For Comparative Example 1, the shear strength after joining was a low value of 12 MPa or less. It is believed that due to the thermal stress acting on the joint when returned to ordinary temperature after the joining operation, defects are formed at the joining layer 5 due to the metal nanoparticles. As opposed to this, Invention Examples 1 to 9 were provided with metal foils in the joining structures and could realize good shear strengths after joining operations. It is believed that the metal foils absorbed the differences in deformation due to the differences in the amounts of thermal shrinkage and were able to prevent defects in the joining layers of the metal nanoparticles. Invention Examples 1, 2, 5, 8, and 9 used metal foils constituted by Al or an Al alloy foil, but used metal nanoparticles of the metal nanoparticle layers constituted by Ni nanoparticles, so could obtain the same good joined assembly quality.

Example 3

In the joined assembly finished being joined at Example 2, in Invention Examples 1 to 9 of Table 2, the parts were joined and cooled to ordinary temperature, then treated in a 300° C. nitrogen atmosphere for 30 minutes and cooled to ordinary temperature, then the joint was measured for shear strength. As a result, no deterioration of strength could be found compared with the shear strength right after the joining operation.

INDUSTRIAL APPLICABILITY

The present invention can give a joining structure which has a good joining strength when joining different types or the same types of metals, so can be utilized in all sorts of industries such as the electrical and electronic industries and the machine industries.

REFERENCE SIGNS LIST 1. first joined member
2. second joined member
3. metal layer forming first surface to be joined
4. metal layer forming second surface to be joined
5. joining layer
6. first joining layer
7. metal foil
8. second joining layer

The invention claimed is:

1. A metal joining structure where surface metals of two joined members are joined through a joining layer including metal nanoparticles, wherein the surface metal of at least one said joined member is Al or an Al alloy and said metal nanoparticles are Ni nanoparticles,
wherein Al content of the Al alloy is 85 mass % or more.

2. The metal joining structure according to claim 1, wherein at least one surface metal among said joined members is Al or an Al alloy and wherein the content of said Ni nanoparticles in the metal content included in said joining layer is 10 mass % or more.

3. The metal joining structure according to claim 1, wherein at least one of said joined members is comprised of Si, SiC, or a compound semiconductor covered with metal on its surface.

4. The metal joining structure according to claim 2, wherein at least one of said joined members is comprised of Si, SiC, or a compound semiconductor covered with metal on its surface.

5. A metal joining method comprising the steps of forming a joining layer including metal nanoparticles between surface metals of two joined members and heating it to join the two joined members through said joining layer, wherein, the surface metal of at least one said joined member is Al or an Al alloy, said metal nanoparticles are Ni nanoparticles, and the heating temperature is 200° C. or more,
wherein Al content of the Al alloy is 85 mass % or more.

6. The metal joining method according to claim 5, wherein at least one surface metal among said joined members is Al or an Al alloy and wherein the content of said Ni nanoparticles in the metal content included in said joining layer is 10 mass % or more.

7. A metal joining structure where surface metals of two joined members are joined through a joining layer containing metal nanoparticles, wherein said joining layer is formed by a first joining layer containing metal nanoparticles, a metal foil, and a second joining layer containing metal nanoparticles in this order,
wherein said metal foil has higher ductility than that of said first joining layer and said second joining layer.

8. The metal joining structure according to claim 7, wherein said metal foil is Al, an Al alloy, Ag, an Ag alloy, Au or an Au alloy, and, when said metal foil is Al or an Al alloy, said metal nanoparticles are Ni nanoparticles, and when said metal foil is any one of Ag, an Ag alloy, Au or an Au alloy, said metal nanoparticles are nanoparticles comprised of at least one of Ag, Au, Cu, or Ni.

9. The metal joining structure according to claim 7, wherein at least one surface metal among said joined members is Al, an Al alloy, Ag, an Ag alloy, Au or an Au alloy, and, when said at least one surface metal among said joined members is Al or an Al alloy, the content of Ni nanoparticles in the metal content included in said joining layer is 10 mass % or more, and, when said at least one surface metal is any one of Ag, an Ag alloy, Au or an Au alloy, the total of metal nanoparticles which are comprised of at least one of Ag, Au, Cu, or Ni among the metal content included in said joining layer is 10 mass % or more.

10. The metal joining structure according to claim 8, wherein at least one surface metal among said joined members is Al, an Al alloy, Ag, an Ag alloy, Au or an Au alloy, and, when said at least one surface metal among said joined members is Al or an Al alloy, the content of Ni nanoparticles in the metal content included in said joining layer is 10 mass % or more, and, when said at least one surface metal is any one of Ag, an Ag alloy, Au or an Au alloy, the total of metal nanoparticles which are comprised of at least one of Ag, Au, Cu, or Ni among the metal content included in said joining layer is 10 mass % or more.

11. The metal joining structure according to claim 7, wherein at least one of said joined members is comprised of Si, SiC, or a compound semiconductor covered with metal on its surface.

12. The metal joining structure according to claim 8, wherein at least one of said joined members is comprised of Si, SiC, or a compound semiconductor covered with metal on its surface.

13. The metal joining structure according to claim 9, wherein at least one of said joined members is comprised of Si, SiC, or a compound semiconductor covered with metal on its surface.

14. A metal joining method comprising the steps of forming a joining layer including metal nanoparticles between the surface metals of two joined members and heating it to join the surface metals of the two joined members, wherein said joining layer is comprised of a first joining layer containing metal nanoparticles, a metal foil, and a second joining layer containing metal nanoparticles in this order, and wherein said metal foil is Al, an Al alloy, Ag, an Ag alloy, Au or an Au alloy, and, when said metal foil is Al or an Al alloy, said metal nanoparticles are Ni nanoparticles, and when said metal foil is any one of Ag, an Ag alloy, Au or an Au alloy, said metal nanoparticles are nanoparticles comprised of at least one of Ag, Au, Cu, or Ni, and the heating temperature is 200° C. or more, wherein Al content of the Al alloy is 85 mass % or more.

15. The metal joining method according to claim 14, wherein, when the metal foil included in said joining layer is Al or an Al alloy, the content of Ni nanoparticles is 10 mass % or more, while, when said metal foil is any one of Ag, an Ag alloy, Au or an Au alloy, the total of said metal nanoparticles comprised of at least one of Ag, Au, Cu, or Ni is 10 mass % or more.

16. A metal joining material comprising of a first joining layer containing metal nanoparticles, a metal foil, and a second joining layer containing metal nanoparticles formed in this order,
wherein said metal foil has higher ductility than that of said first joining layer and said second joining layer.

17. The metal joining material according to claim 16, wherein said metal foil is Al, an Al alloy, Ag, an Ag alloy, Au or an Au alloy, and, when said metal foil is Al or an Al alloy, said metal nanoparticles are Ni nanoparticles, and when said metal foil is any one of Ag, an Ag alloy, Au or an Au alloy, said metal nanoparticles are nanoparticles comprised of at least one of Ag, Au, Cu, or Ni.

\* \* \* \* \*